United States Patent [19]

Sakaue et al.

[11] 4,322,696
[45] Mar. 30, 1982

[54] WEIGHTING VOLTAGE SUPPLY CIRCUIT FOR A TRANSVERSAL FILTER

[75] Inventors: Tatsuo Sakaue; Tetsuya Iida, both of Yokohama; Chikara Sato, Kawasaki, all of Japan

[73] Assignee: Tokyo Shibaura Denki Kabushiki Kaisha, Japan

[21] Appl. No.: 118,679

[22] Filed: Feb. 5, 1980

[30] Foreign Application Priority Data

Feb. 20, 1979 [JP] Japan .................................. 54-17919

[51] Int. Cl.³ .................... H03H 15/02; G11C 19/28; G11C 27/02
[52] U.S. Cl. .................................... 333/165; 333/166
[58] Field of Search ................ 333/166, 165; 357/24; 307/221 R, 221 C, 221 D; 328/167

[56] References Cited

U.S. PATENT DOCUMENTS

| 4,034,199 | 7/1977 | Lampe et al. ............... 357/24 X |
| 4,080,581 | 3/1978 | Sakaue et al. .................. 333/165 |
| 4,249,145 | 2/1981 | Sakaue et al. .................. 333/165 |

Primary Examiner—Marvin L. Nussbaum
Attorney, Agent, or Firm—Finnegan, Henderson, Farabow, Garrett & Dunner

[57] ABSTRACT

A circuit for supplying weighting voltages to multipliers of a transversal filter comprises a plurality of electronic switches associated with the multipliers for switching magnitudes of the weighting voltages applied to the multipliers, and memory cells associated with the respective electronic switches for storing digital data to turn on or off the corresponding electronic switches. Those memory cells are sequentially addressed by address circuits to store data which define the magnitudes of the weighting voltages applied to the multipliers.

9 Claims, 8 Drawing Figures

FIG. 2  FIG. 3  FIG. 4
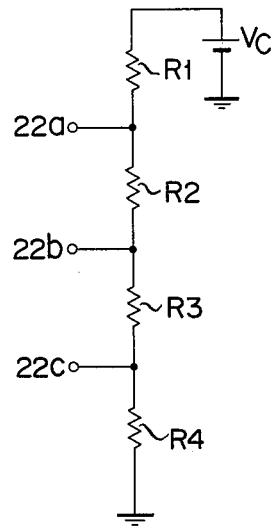
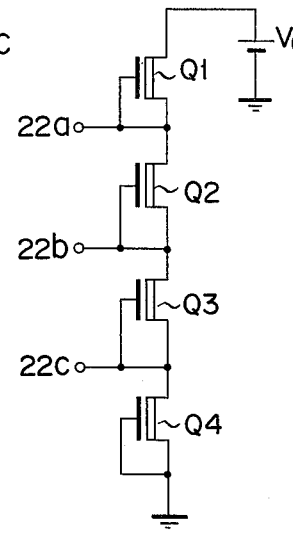
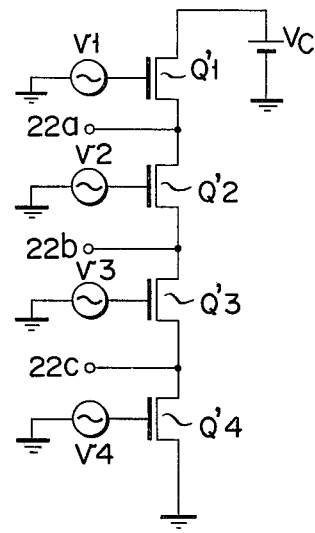
FIG. 5
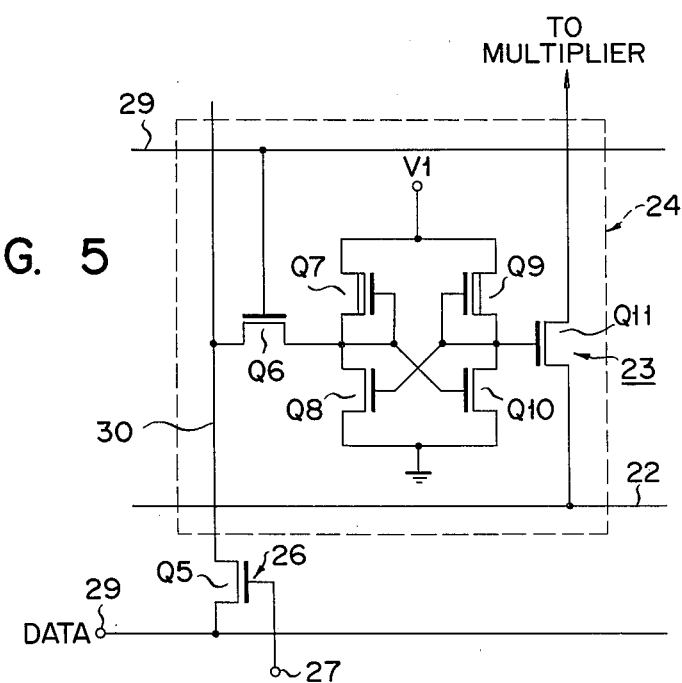

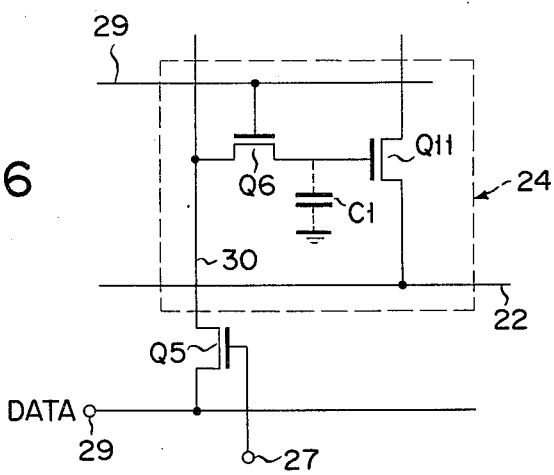
FIG. 6
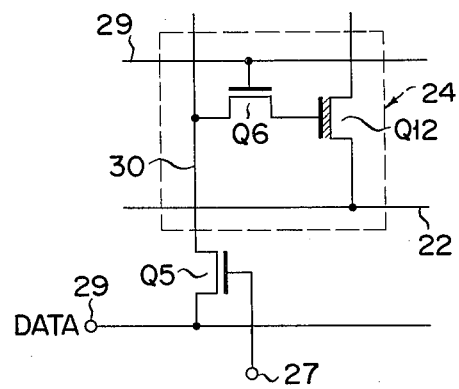
FIG. 7
FIG. 8
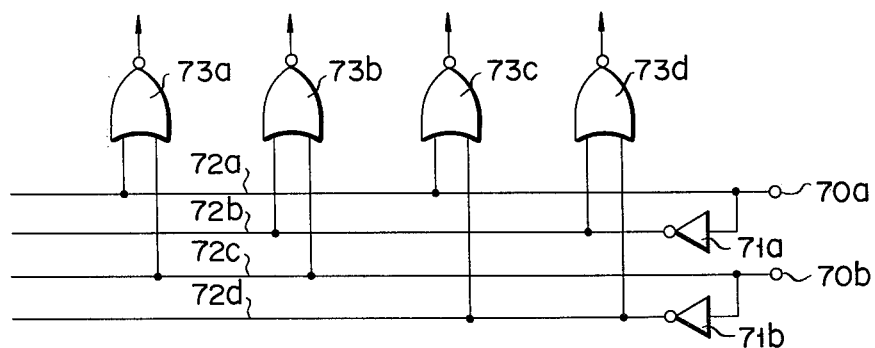

WEIGHTING VOLTAGE SUPPLY CIRCUIT FOR A TRANSVERSAL FILTER

BACKGROUND OF THE INVENTION

The present invention relates to a charge transfer type transversal filter with programmable weighting coefficients.

As already known, a charge transfer device (CTD) such as a charge-coupled device (CCD) and a bucket-brigade device (BBD) is applicable to a transversal filter by taking advantage of its delay function.

If the weighting coefficients of multipliers included in the transversal filter are properly set, it is possible to form a filter with a desired frequency characteristic. In one of the conventional transversal filters, the weighting coefficients of the multipliers are set by control voltages externally applied to an integrated circuit. In this type conventional transversal filter, a plurality of weighting coefficient control voltage sources are provided outside the integrated circuit. For this reason, the number of terminals of the integrated circuit increases to make the device large in size. Further, the control voltages must be adjusted in their magnitudes independently.

In another example of a conventional transversal filter, a CCD analog shift register or capacitor memory is provided within an integrated circuit so as to store the weighting coefficient control voltages to be applied to the multipliers. In this type system, the number of terminals of the integrated circuit decreases but the storing time for the control voltages is restricted within a range of several milliseconds to several hundreds of milliseconds, so that the control voltages must repeatedly be loaded into the memory system. This makes the transversal filter system very complicated. The storing time is influenced by the manufacturing process and by temperature variations. Accordingly, it is very difficult to set the weighting coefficients with high accuracy. As known, in the CCD or the capacitor memory, the storing time is reduced by about $\frac{1}{2}$ for each 10° C. rise in temperature.

SUMMARY OF THE INVENTION

Accordingly, an object of the invention is to provide a weighting voltage supply circuit for a transversal filter which overcomes the above-mentioned disadvantages.

Another object of the invention is to provide a weighting voltage supply circuit for a transversal filter which uses digital data for switching the magnitude of a weighting voltage.

According to the invention, there is provided a weighting voltage supply circuit for a transversal filter comprising a plurality of electronic switches associated with multipliers of the transversal filter to switch the magnitudes of the weighting voltages to be supplied to the multipliers, memory cells associated with the electronic switches to store data to turn on or off the corresponding electronic switches, and circuit means to sequentially load data into the memory cells.

In an embodiment of the invention, a single weighting voltage generating circuit provided commonly for multipliers of a transversal filter has a plurality of outputs from which a plurality of weighting voltages with different magnitudes are taken out. The electronic switches are used to couple a desired one of the weighting voltages to the corresponding multiplier.

BRIEF DESCRIPTION OF THE DRAWINGS

FIGS. 2 through 4 illustrate embodiments of the weighting voltage source shown in FIG. 1;

FIGS. 5 through 7 illustrate embodiments of the memory cells used in the circuit shown in FIG. 1; and FIG. 8 shows a circuit diagram of an embodiment of an address circuit used in the circuit shown in FIG. 1.

DETAILED DESCRIPTION OF THE PREFERRED EMBODIMENTS

Figure 1:
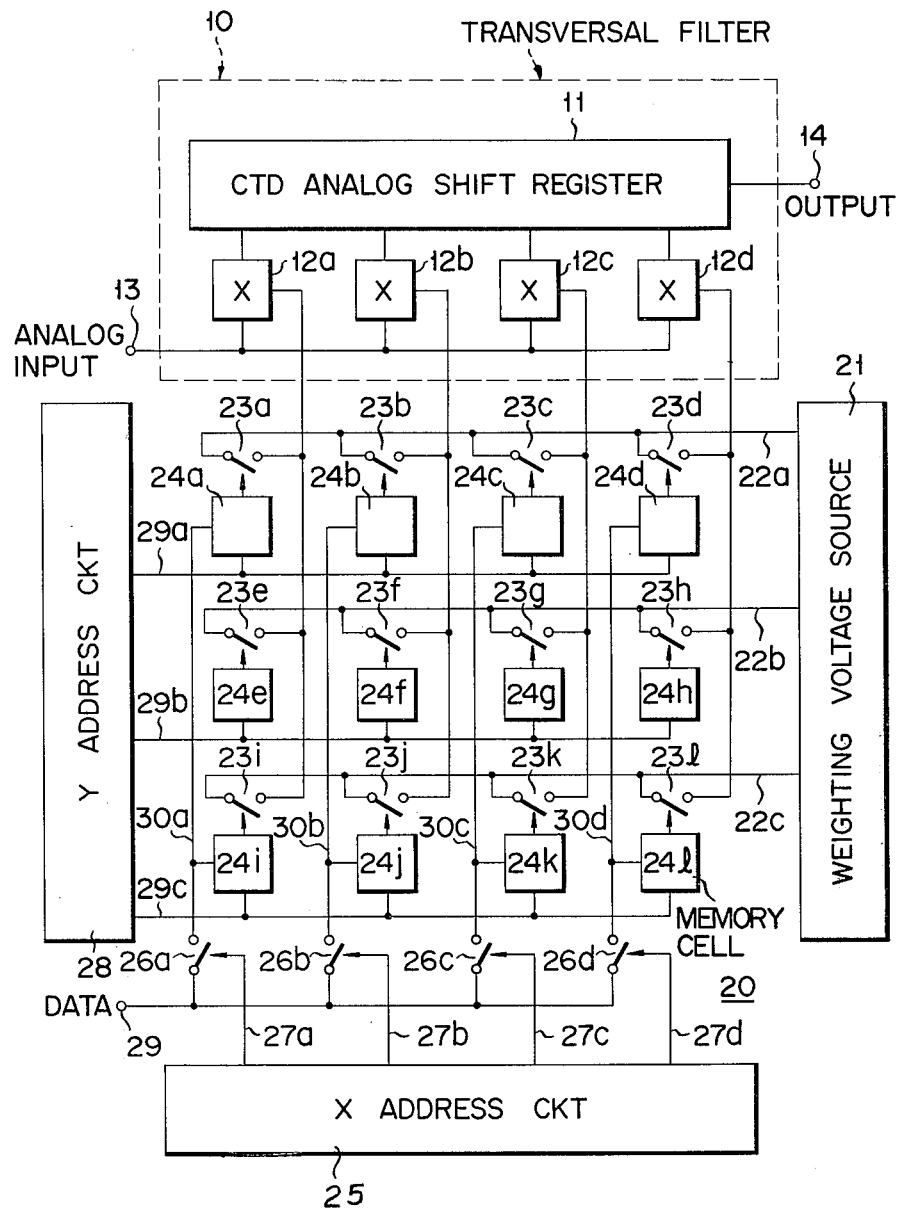
FIG. 1 schematically illustrates a transversal filter system incorporating a weighting voltage supply circuit according to an embodiment of the invention.

In FIG. 1, reference numeral 10 designates a transversal filter which is, in this embodiment, an input-weighted transversal filter as disclosed in U.S. Pat. No. 4,080,581. The transversal filter 10 includes a CTD analog shift register 11 having a plurality of stages and multipliers 12a to 12d which are so connected to commonly receive an analog input signal applied to an input terminal 13, and which multiply the input signal by weighting coefficients dependent on the magnitudes of weighting voltages applied thereto. The multipliers 12a to 12d inject weighted signal charge packets to the corresponding shift register stages. The output signal from the transversal filter 10 is taken out of an output terminal 14 coupled with the final stage of the shift register 11. FIG. 1 shows an example in which the analog shift register 11 is comprised of four stages. The transversal filter may be an output-weighted transversal filter in which the inputs of multipliers are coupled with the respective stages of an analog shift register and the outputs thereof are coupled together to an output terminal from which an output signal of the transversal filter is derived.

The supply of weighting voltages to the multipliers 12a to 12d is made by a weighting voltage signal supply circuit 20 prepared on a semiconductor substrate on which the transversal filter 10 is also formed. The weighting voltage signal supply circuit 20 is comprised of a weighting coefficient control voltage source 21, electronic switches 23a to 23l and 26a to 26d, digital memory cells 24a to 24l, an X address circuit 25 and a Y address circuit 28. The weighting control voltage source 21 is so arranged as to provide control voltages with the different magnitudes at output terminals 22a to 22c. The output terminal 22a is coupled with the multipliers 12a to 12d through the electronic switches 23a to 23d. The output terminal 22b is coupled with the multipliers 12a to 12d through the electronic switches 23e to 23h. The output terminal 22c is coupled with the multipliers 12a to 12d through the electronic switches 23i to 23l. The electronic switches 23a to 23l are controlled by data stored in the corresponding digital memories 24a to 24l, respectively. The digital memories 24a to 24l are sequentially addressed by the X and Y address circuits 25 and 28 to store data "1" or "0" applied to an input terminal 29. More specifically, the input terminal 29 is coupled through the electronic switch 26a with an X line 30a commonly connected to the memories 24a, 24e and 24i, through the electronic switch 26b with an X line 30b commonly connected to the memories 24b, 24f and 24j, through the electronic switch 26c with an X line 30c commonly connected to the memories 24c, 24g and 24k, and through the electronic switch 26d to an X line 30d commonly connected to the memories 24d, 24h and 24l. The electronic switches 26a to 26d are controlled by outputs 27a to 27d of the X address circuit 25, respectively.

The Y address circuit 28 has an output or Y line 29a commonly coupled with the memories 24a to 24d, an output or Y line 29b commonly connected to the memories 24e to 24h, and an output or Y line 29c commonly connected to the memories 24i to 24l.

For data write, the memories 24a to 24l are sequentially addressed by the X and Y address circuits 25 and 28. A memory being addressed is supplied with data through the corresponding X line and is brought to data write state by the output voltage on the Y line so as to store binary data being applied to the input terminal 29. When the binary data "1", for example, is stored in the memory, the corresponding electronic switch is rendered conductive to apply the control voltage signal on the corresponding output line of the control voltage signal source 21 to the corresponding multiplier. The memories coupled with a common X line store the data in such a manner that binary data "1" to turn on the electronic switch is loaded into a single memory and binary data "0" to turn off the electronic switch is loaded into the remaining memories. As a result, one of the outputs 22a to 22c of the control voltage signal source 21 is coupled with one of the multipliers 12a to 12d which corresponds to the memories coupled with the common X line. For example, when the memory 24a stores "1" while the memories 24e and 24i store "0", the electronic switch 23a is turned on while the electronic switches 24e and 24i are turned off, so that only the output line 22a of the control signal source 21 is coupled with the multiplier 12a.

After the data write, the weighting coefficients of the multipliers 12a to 12d remains unchanged. Modification of the weighting coefficients may be easily performed by changing data stored in the memories 24a to 24l.

With reference to FIGS. 2 to 4, there are shown circuit arrangements of the control voltage signal source 21. As shown, all the circuit arrangements are formed of a voltage dividing network. In the example of FIG. 2, impedance means R1 to R4 such as resistance elements are connected in series across a DC power source Vc. The outputs 22a to 22c are taken out of connection points between the adjacent resistive elements. In FIG. 3, depletion MOS FET's Q1 to Q4 with their gates shunted to their sources are connected in series across a DC power source Vc. In the example of FIG. 4, MOS FET's Q'1 to Q'4 are connected in series across a DC power source Vc and AC signal sources v1 to v4 are each connected between the gate of corresponding one of FET's Q'1 to Q'4 and circuit ground. In the case of a control voltage signal source in FIG. 4, an output voltage with AC signals superposed thereon is taken out. Accordingly, a transversal filter may be used as an analog-analog correlator.

FIG. 5 shows a static memory cell 24 including a flip-flop circuit composed of FET's Q7 to Q10. The data applied to the input terminal 29 is transferred to an X line 30 through an analog switch 26 or FET which is made conductive by an X address signal on the output 27 of the X address circuit 25. The data on the X line 30 is applied to the flip-flop circuit through the FET Q6 which is made conductive by a Y address signal on the Y line 29, and stored in flip-flop circuit. The data which is complementary to the data applied to the flip-flop circuit is taken out of the connection point between the FET's Q9 and Q10 and applied to the gate of an FET Q11 or analog switch 23. When the output data has a level to turn on the FET Q11, the output line 22 of the control voltage signal souce 21 is coupled with a multiplier through the FET Q11.

In the circuit arrangement shown in FIG. 5, the gate of the FET Q11 may be connected to the connection point between the FET's Q7 and Q8. In this case, the output data to turn on or off the FET Q11 is coincident with the data applied to the memory cell in polarity. The depletion type FET's Q7 and Q9 used in the embodiment may be replaced by enhancement type FET's or resistors.

When the static memory cells are used, the data stored are held so long as the power source is not turned off. Further, the data may easily be changed.

Turning now to FIG. 6, there is shown a dynamic memory cell in which data is temporarily stored in a stray capacitor C1 of the FET Q11. In the case of dynamic memory, the storing time of data is restricted and therefore a refreshing operation is required for holding the data stored therein.

FIG. 7 shows a memory cell using MNOS FET Q12 as a memory element. In the memory cell, the data is held even after the power supply is ceased. The input data is semipermanently stored therein as an ON-OFF signal of the MNOS FET Q12. It will be understood that the FET Q12 is used as an analog switch. The MNOS FET may be substituted by an unvolatile memory such as FAMOS FET.

FIG. 8 shows an example of the X or Y address circuit which uses a decoder circuit. Address input signals applied to the address input terminals 70a and 70b are inverted by inverters 70a and 70b, so that four address signals are delivered to address lines 72a to 72d. Two-input NOR gates 73a to 73d are coupled with the address lines 72a to 72d, thereby to select one X line or one Y line. A shift register may be used as an address circuit.

The above address format and data format are compatible with microcomputers which are in widespread use. If, by giving instructions to the microcomputer, address signals and data signals are generated therefrom, and applied to a transversal filter system as described above, a band-pass filter, matched filter, automatic ghost canceller, echo canceller or automatic equalizer may be easily realized.

What we claim is:

1. In a transversal filter with multipliers each multiplying an applied signal with a weighting coefficient dependent on the magnitude of a weighting voltage, a circuit for applying weighting voltages to said multipliers comprising:
    a plurality of electronic switches divided into groups of switches with each group of switches associated with a corresponding multiplier for controlling the magnitude of the weighting voltage applied to said corresponding multiplier;
    a plurality of memory cells respectively associated with said electronic switches for storing digital data to turn on or off corresponding electronic switches; and
    circuit means for supplying to said memory cells data to turn on or off said corresponding electronic switches.

2. In a transversal filter with multipliers each multiplying an applied signal with a weighting coefficient dependent on the magnitude of a weighting voltage, a circuit for applying weighting voltages to said multipliers comprising:
- weighting voltage generating circuit means with a plurality of outputs for providing voltages with different magnitudes;
- a plurality of sets of electronic switches respectively corresponding to said outputs of said weighting voltage generating circuit means, said electronic switches of each set, when turned on, coupling a corresponding output of said weighting voltage generating circuit means to said multipliers; respectively;
- memory cells respectively associated with said electronic switches for storing data to turn on or off said corresponding electronic switches; and
- circuit means for sequentially loading data into said memory cells to define the magnitudes of said weighting voltages applied to said multipliers.

3. A transversal filter according to claim 2, wherein said weighting voltage generating circuit means is a voltage dividing circuit having impedance means connected in series across a power source.

4. A transversal filter according to claim 3, wherein said impedance means are resistive elements.

5. A transversal filter according to claim 3, wherein said impedance means are field effect transistors.

6. A transversal filter according to claim 1 or 2, wherein said memory cells are each a static random access memory including a flip-flop circuit.

7. A transversal filter according to claim 1 or 2, wherein said memory cells are each a dynamic memory cell.

8. A transversal filter according to claim 1 or 2, wherein a single field effect transistor both stores the digital data and operates as the electronic switch of each of said corresponding electronic switches and memory cells.

9. A transversal filter according to claim 8, wherein said field effect transistor is of MNOS type.

* * * * *